United States Patent
Sandhu et al.

(10) Patent No.: US 7,588,982 B2
(45) Date of Patent: Sep. 15, 2009

(54) METHODS OF FORMING SEMICONDUCTOR CONSTRUCTIONS AND FLASH MEMORY CELLS

(75) Inventors: Gurtej S. Sandhu, Boise, ID (US); Kirk D. Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 155 days.

(21) Appl. No.: 11/512,781

(22) Filed: Aug. 29, 2006

(65) Prior Publication Data
US 2008/0057639 A1  Mar. 6, 2008

(51) Int. Cl.
*H01L 21/336* (2006.01)
(52) U.S. Cl. .................. 438/257; 438/294; 438/299; 257/E29.13
(58) Field of Classification Search ......... 438/257–266, 438/275–308; 257/E29.13, E51.006
See application file for complete search history.

(56) References Cited

U.S. PATENT DOCUMENTS

| | | | |
|---|---|---|---|
| 5,102,814 A | | 4/1992 | Woo |
| 5,106,772 A | | 4/1992 | Lai |
| 5,111,270 A | | 5/1992 | Tzeng |
| 6,284,597 B1 * | | 9/2001 | Hong ............ 438/257 |
| 6,329,248 B1 * | | 12/2001 | Yang ............ 438/267 |
| 6,459,121 B1 * | | 10/2002 | Sakamoto et al. ....... 257/315 |
| 6,518,618 B1 | | 2/2003 | Fazio et al. |
| 2003/0013250 A1 * | | 1/2003 | Koh ............ 438/201 |
| 2003/0207520 A1 * | | 11/2003 | Tseng ............ 438/200 |
| 2005/0212034 A1 | | 9/2005 | Saaago et al. |
| 2006/0131666 A1 | | 6/2006 | Li et al. |
| 2007/0023847 A1 * | | 2/2007 | Rhee et al. ............ 257/408 |

FOREIGN PATENT DOCUMENTS

WO PCT/US2007/017139  3/2009

OTHER PUBLICATIONS

PCT/US/2007/017139 Aug. 1, 2007 Search Report.
PCT/US/2007/017139 Aug. 1, 2007 Written Opinion.

* cited by examiner

*Primary Examiner*—H Jey Tsai
(74) *Attorney, Agent, or Firm*—Wells St. John P.S.

(57) ABSTRACT

Some embodiments include methods of forming flash memory cells and semiconductor constructions, and some embodiments include semiconductor constructions. Some embodiments may include a method in which a semiconductor substrate is provided to have a plurality of active area locations. Floating gates are formed over the active area locations, with the floating gates having widths that are entirely sub-lithographic. Adjacent floating gates are spaced from one another by gaps. Dielectric material and control gate material are formed over the floating gates and within the gaps. Some embodiments may include a construction in which a pair of adjacent floating gates are over a pair of adjacent active areas, with the floating gates being spaced from one another by a distance which is greater than a distance that the active areas are spaced from one another.

17 Claims, 15 Drawing Sheets

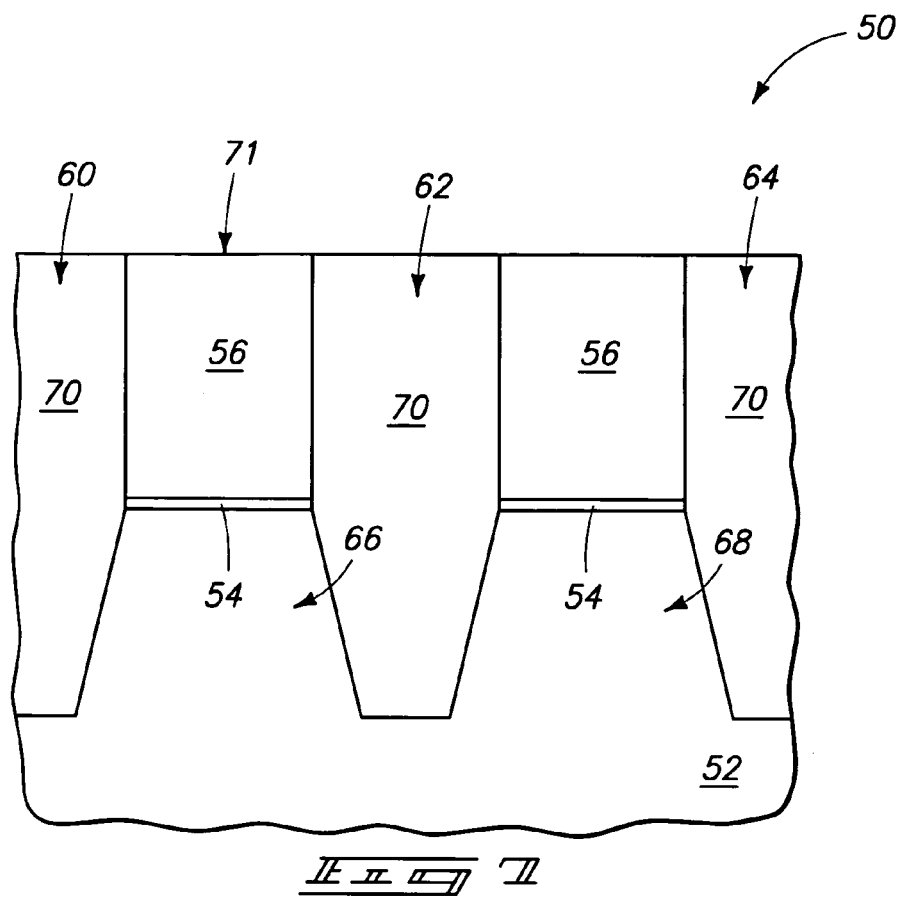
F I G 7
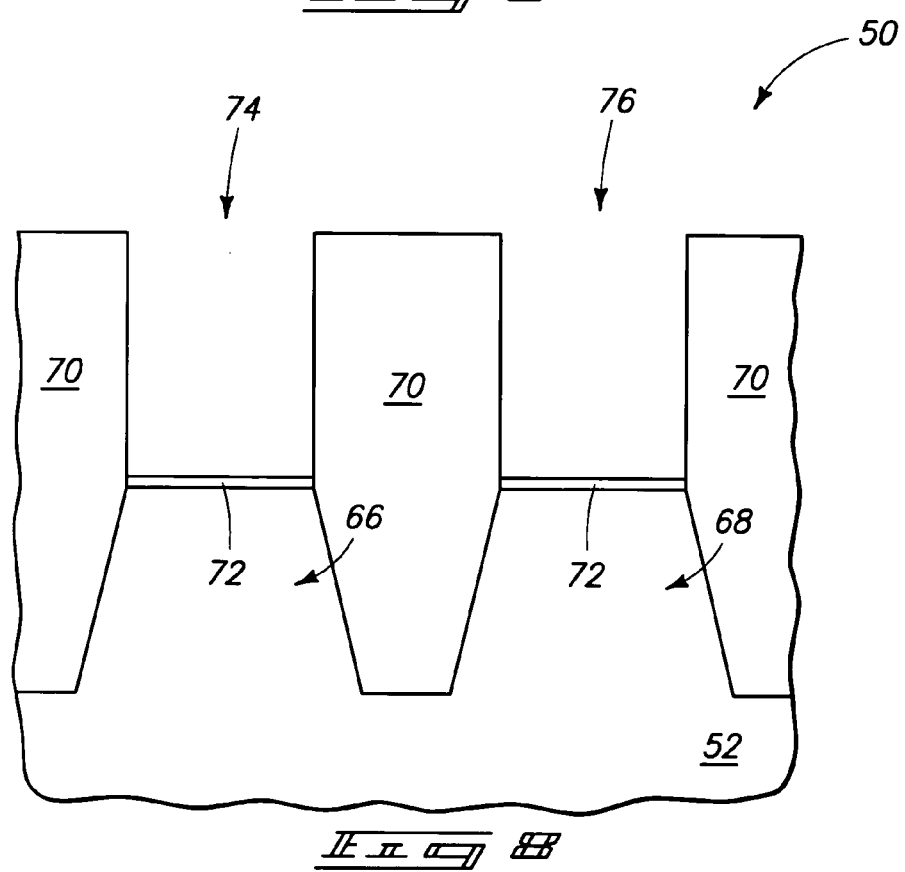
F I G 8

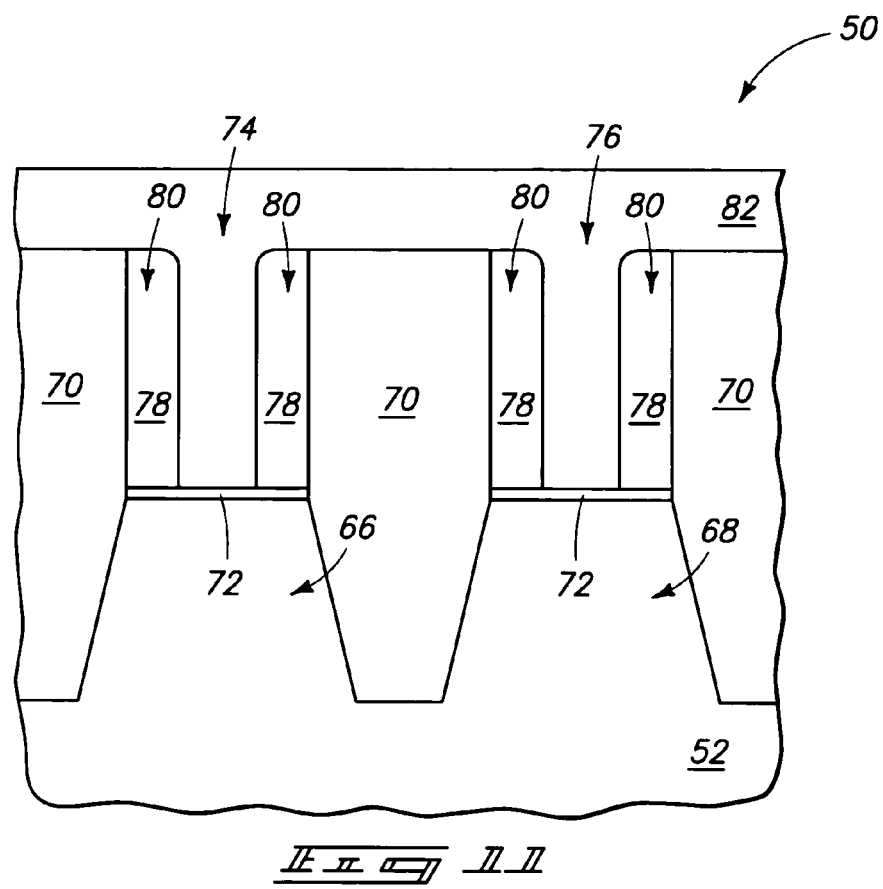
F I G 11
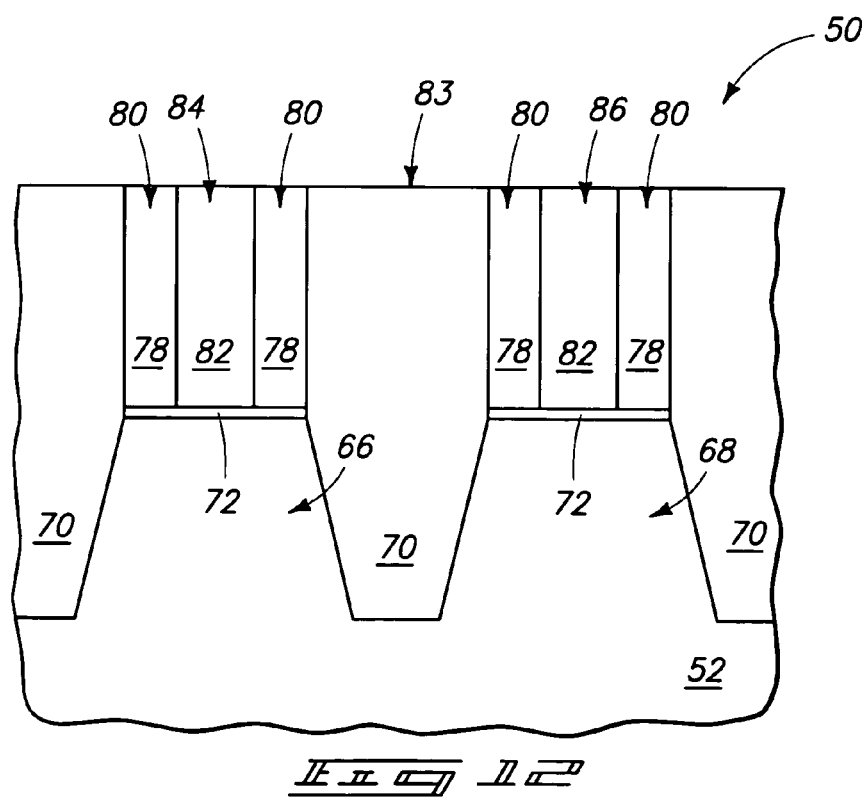
F I G 12

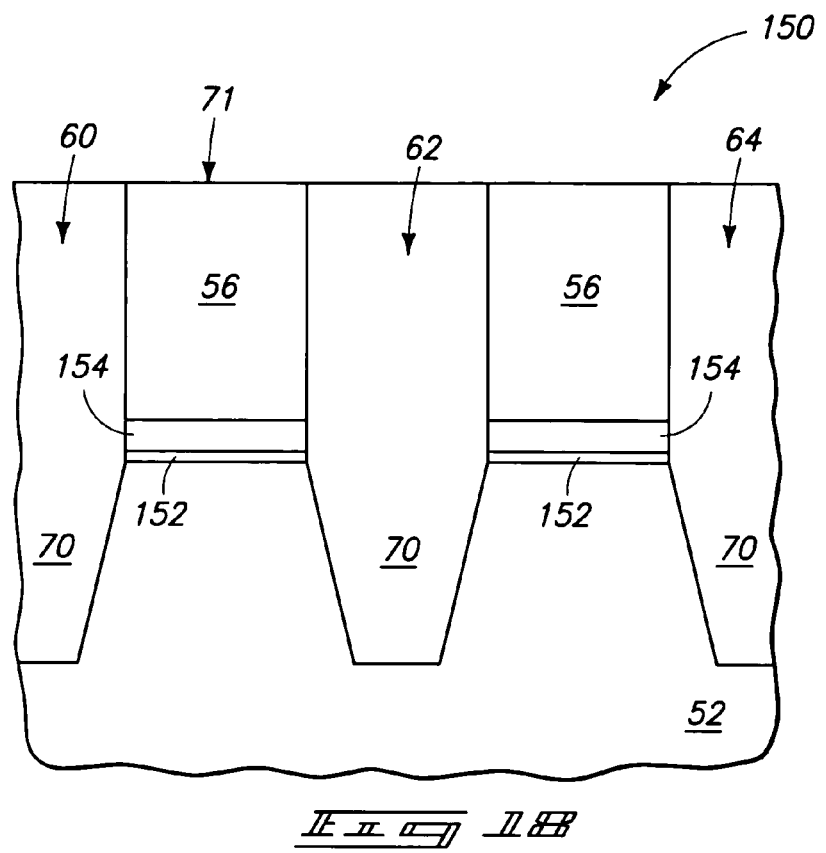
F I G 18
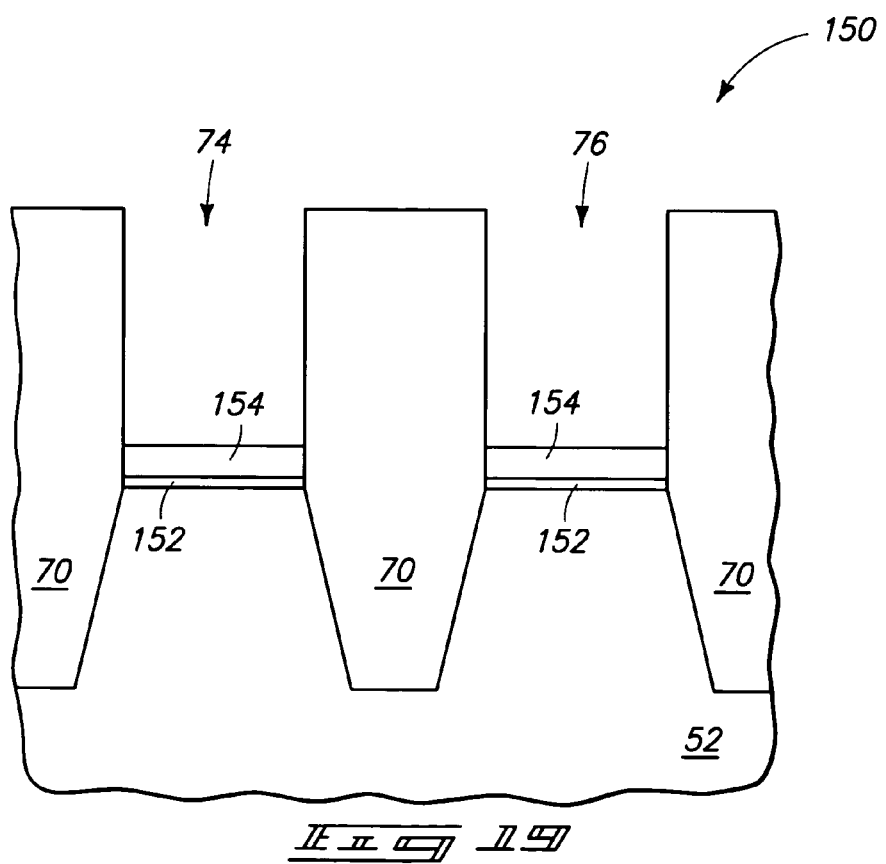
F I G 19

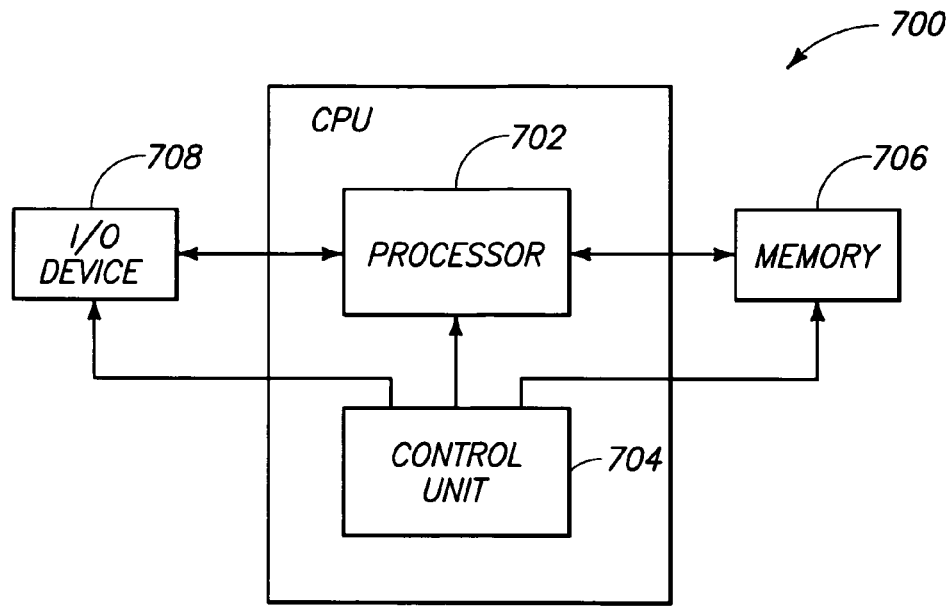
_Fig. 28_
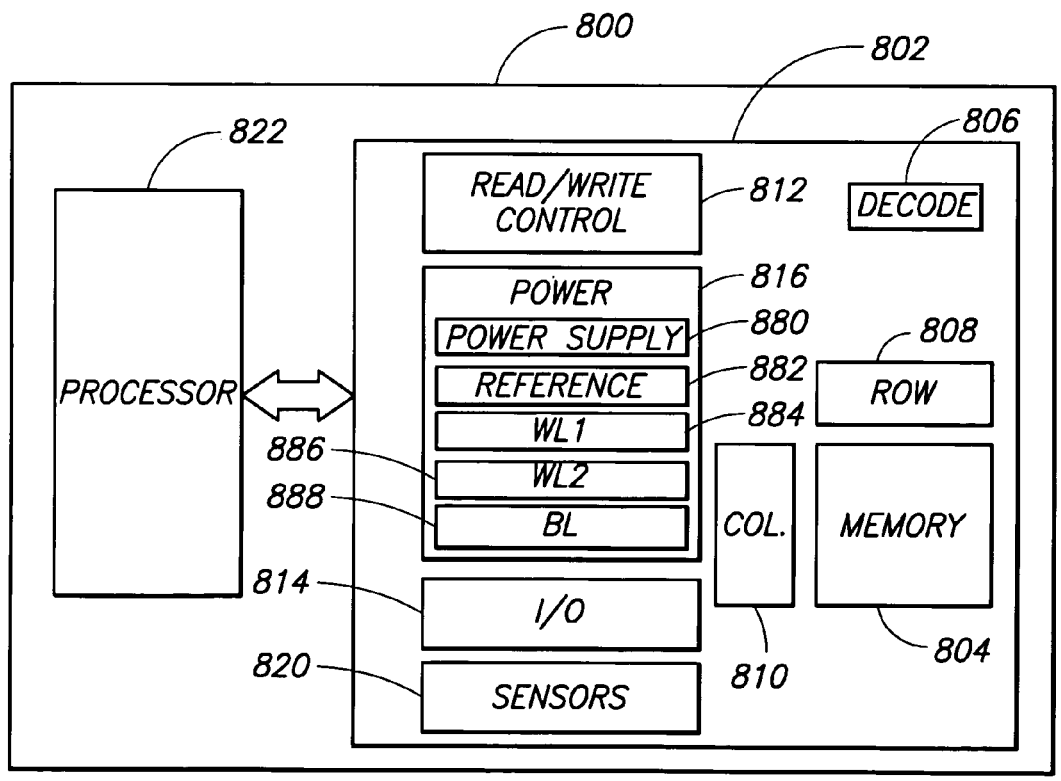
_Fig. 29_

US 7,588,982 B2

METHODS OF FORMING SEMICONDUCTOR CONSTRUCTIONS AND FLASH MEMORY CELLS

TECHNICAL FIELD

The technical field is semiconductor constructions, and methods of forming semiconductor constructions; such as, for example, methods of forming flash memory (i.e., nonvolatile memory).

BACKGROUND

A continuing goal of semiconductor device fabrication is to increase the number of devices associated with a given area of semiconductor real estate to thereby achieve an increased level of integration. One facet of such goal is to scale new generations of devices to be smaller than preceding generations.

Many modern electronic systems utilize nonvolatile memory (flash memory). It is desired to increase the level of integration of flash memory. However, a problem occurs in scaling flash memory cells in trying to achieve desired coupling between control and floating gates while avoiding undesired interference between adjacent floating gates. A prior art method which has been developed to address such problem is discussed with reference to FIGS. 1-4.

FIG. 1 shows a semiconductor construction 10 comprising a base 12 having a series of isolation regions 14 extending therein, and comprising floating gates 16 spaced from one another by the isolation regions.

Base 12 may comprise, consist essentially of, or consist of, for example, monocrystalline silicon lightly-doped with background p-type dopant, and may be referred to as a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Isolation regions 14 comprise insulative material 18 extending into trenches within base 12. Insulative material 18 may, for example, comprise, consist essentially of, or consist of silicon dioxide.

Active regions 20 correspond to pillars of base 12 between the isolation regions. The floating gates 16 are formed over the active regions, and separated from the active regions by gate dielectric 22. The gate dielectric may comprise, consist essentially of, or consist of silicon dioxide, and may be referred to as tunnel oxide.

The floating gates 16 comprise two conductive portions 24 and 26, with the portion 24 being wider than the portion 26 in the shown cross-sectional view. Accordingly, portions 24 and 26 together form an inverted "T" shape. The narrow portions 26 of the adjacent floating gates are spaced from one another by a gap 27. It is noted that the inverted "T" shape of the floating gates allows gap 27 to the wider than the gap between the adjacent active regions 20.

The portions 24 and 26 may comprise the same composition as one another, and may, for example, both consist essentially of, or consist of conductively-doped polycrystalline silicon. It is noted that if portions 24 and 26 comprise the same composition as one another, the portions merge to form a single structure. However, the portions are shown separate from one another in FIG. 1 to aid in the description of the structure.

A pair of electrically insulative spacers 28 are adjacent the narrow portions 26 of the floating gates to fill space between the narrow portions and the isolation regions 14.

FIG. 2 shows the floating gates of FIG. 1 incorporated into flash cells 30 and 32. Specifically, dielectric material 34 is provided over the floating gates and within the gap 27 between the floating gates; and control gate material 36 is provided over the dielectric material and also within the gap between the floating gates. The dielectric material 34 may, for example, comprise, consist essentially of, or consist of a stack of silicon dioxide/silicon nitride/silicon dioxide (in other words, a so-called ONO stack). The control gate material 36 may comprise any suitable electrically conductive composition or combination of compositions, including, for example, metals, metal compositions, and/or conductively-doped semiconductor material In some applications, the distance between the adjacent active regions 20 may be 35 nanometers, while the distance between the narrow portions 26 of the floating gates is about 50 nanometers. The dielectric material 34 and control gate material 36 may fit within a space of 50 nanometers, but it would be difficult to fit them within a space of 35 nanometers.

FIGS. 3 and 4 illustrate a method of forming the construction of FIG. 1. FIG. 3 shows construction 10 at a processing stage in which spacers 28 are formed over the first portion 24 of the floating gates to leave openings over the first portion 24. FIG. 4 shows a subsequent processing stage in which polycrystalline silicon 38 is deposited to fill the openings. The construction may then be subjected to planarization followed by an etchback of materials 18 and 28 to form the structure of FIG. 1. Portion 24 and material 38 are shown to not be conductively-doped at the processing stages of FIGS. 3 and 4; implying that the conductive doping will occur between the processing stage of FIG. 4 and the stage shown in FIG. 1. It is to be understood, however, the conductive doping may occur at numerous processing stages. For instance, portions 24 may be conductively-doped prior to the processing stage of FIG. 3; and material 38 may be in situ doped during the deposition of material 38.

It is desired to develop improved methods for forming semiconductor devices, and to develop improved semiconductor structures.

BRIEF DESCRIPTION OF THE DRAWINGS

FIGS. 6-15 illustrate wafer fragments at processing stages subsequent to FIG. 5.

FIGS. 17-25 illustrate wafer fragments at processing stages subsequent to FIG. 16.

FIG. 28 is a high level block diagram of an electronic system embodiment.

FIG. 29 is a simplified block diagram of a memory device embodiment.

DETAILED DESCRIPTION OF THE ILLUSTRATED EMBODIMENTS

New methods of forming non-volatile memory (in other words, flash memory), and new semiconductor constructions are described. A first embodiment is described with reference to FIGS. 5-15, and a second embodiment is described with reference to FIGS. 16-25.

Figure 1:
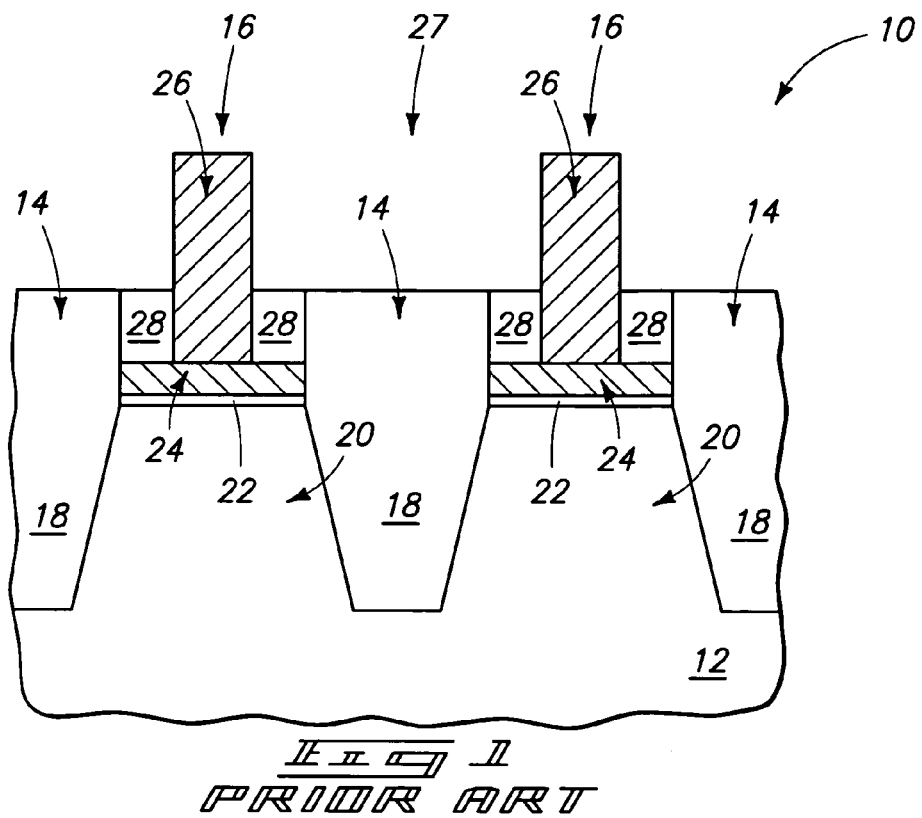
FIG. 1 is a diagrammatic, fragmentary view of a prior art construction illustrating a pair of floating gate constructions.
Figure 2:
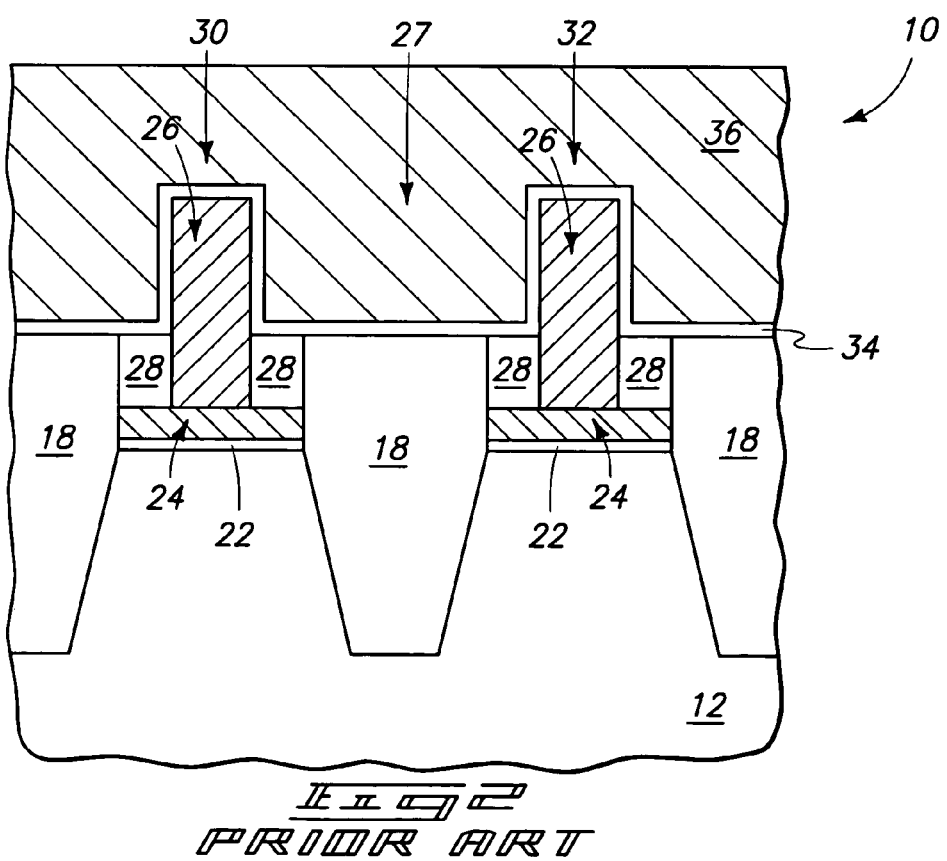
FIG. 2 is a prior art view of the FIG. 1 construction incorporated into a pair of flash memory devices.
Figure 3:
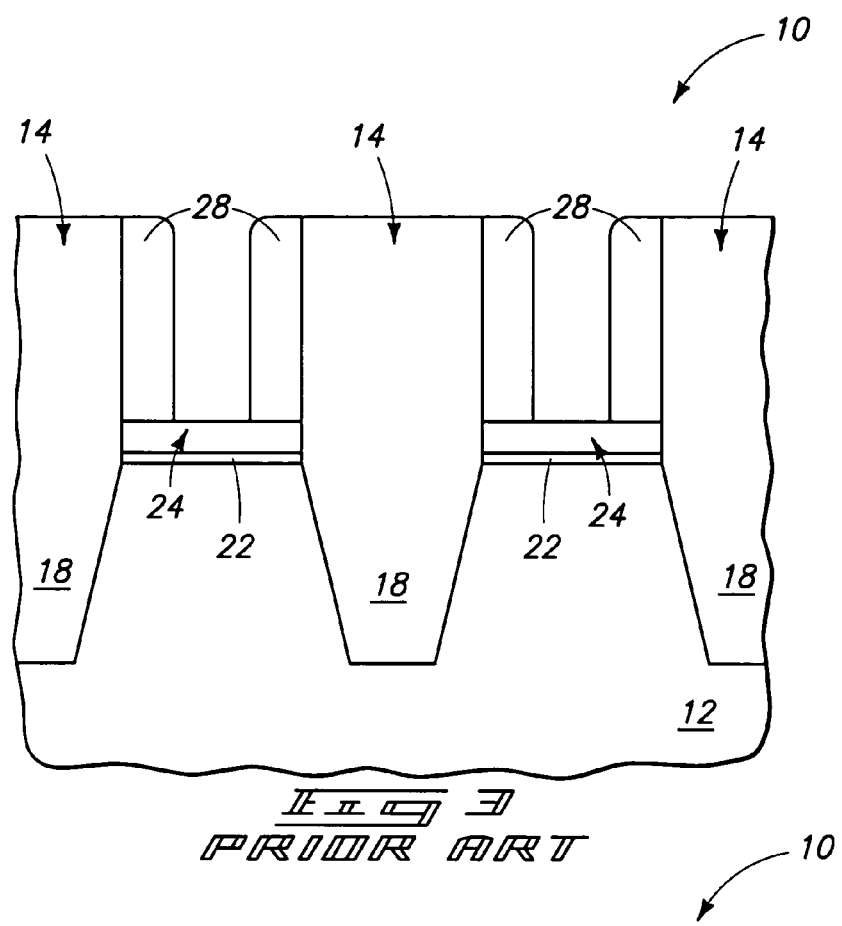
FIG. 3 is a prior art view of a construction at a processing stage prior to that of FIG. 1.
Figure 4:
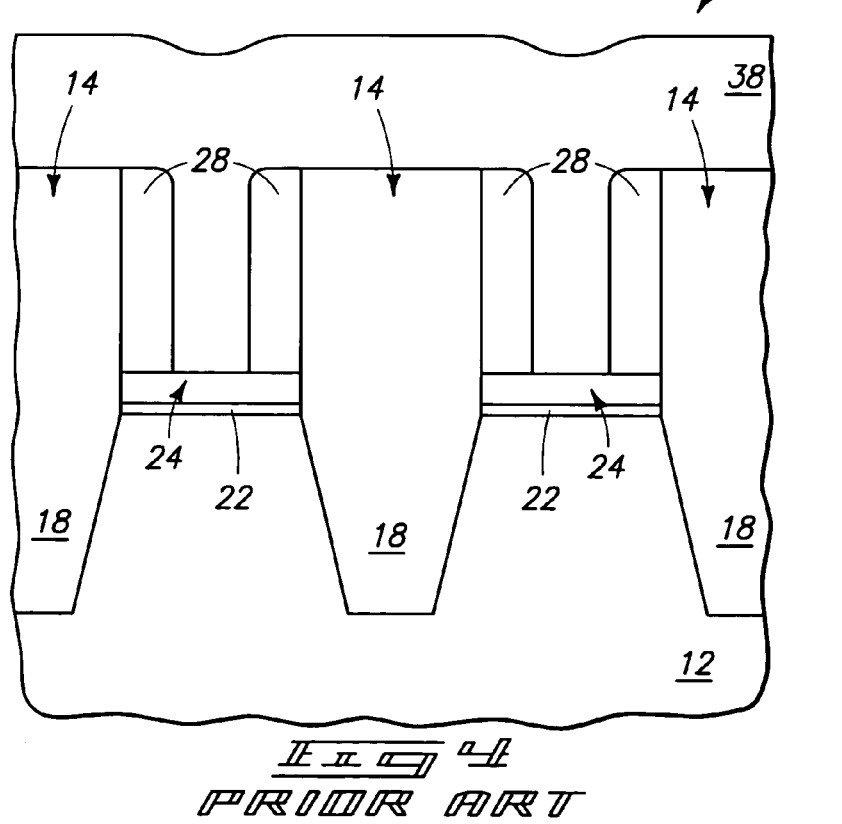
FIG. 4 is a prior art view of the FIG. 3 construction at a processing stage subsequent to that of FIG. 3 and prior to that of FIG. 1.
Figure 5:
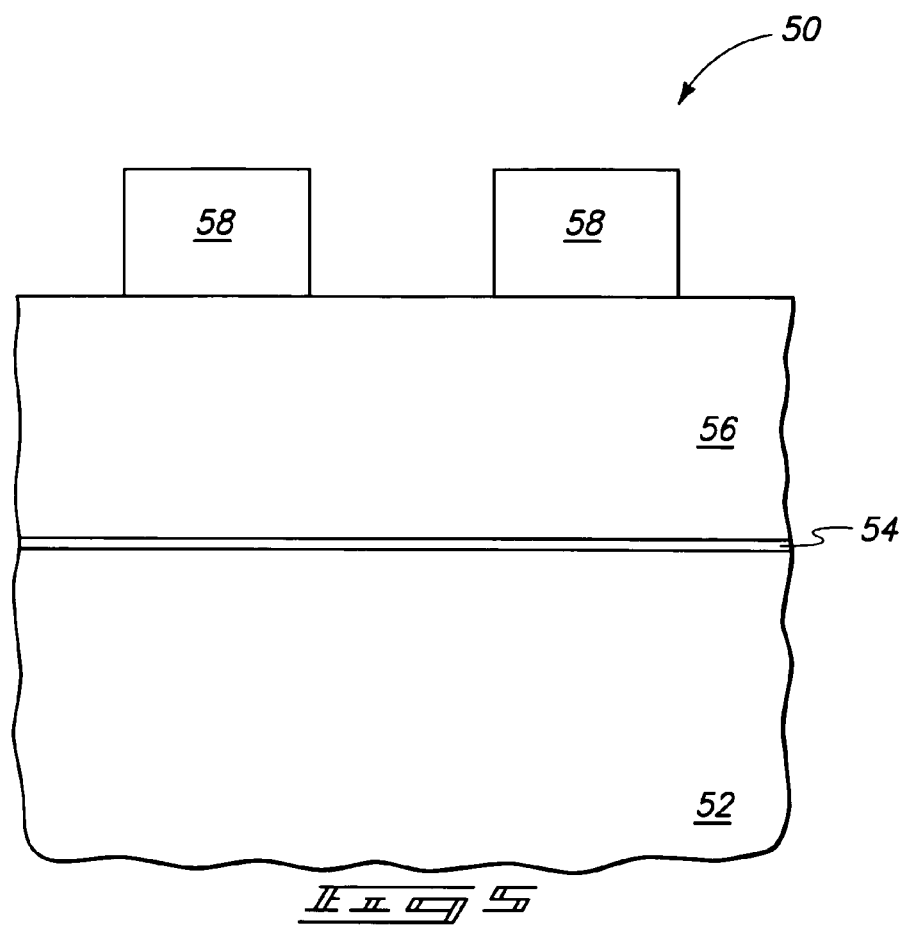
FIG. 5 is a diagrammatic view of a semiconductor wafer fragment shown at a preliminary processing stage.

Referring to FIG. 5, such illustrates a semiconductor construction 50 at a preliminary processing stage. Construction 50 includes a base 52 which may comprise the same compositions as the base 12 discussed above relative to the prior art of FIGS. 1-4. Base 52 may correspond to a monocrystalline silicon wafer lightly doped with appropriate background dopant.

A pad oxide layer 54 is over base 52, and a silicon nitride-containing layer 56 is over the pad oxide layer. The pad oxide layer may comprise, consist essentially of, or consist of silicon dioxide; and the silicon nitride-containing layer may comprise, consist essentially of, or consist of silicon nitride.

A patterned mask 58 is over silicon nitride-containing layer 56. Mask 58 may be, for example, photolithographically patterned photoresist.

Figure 6:
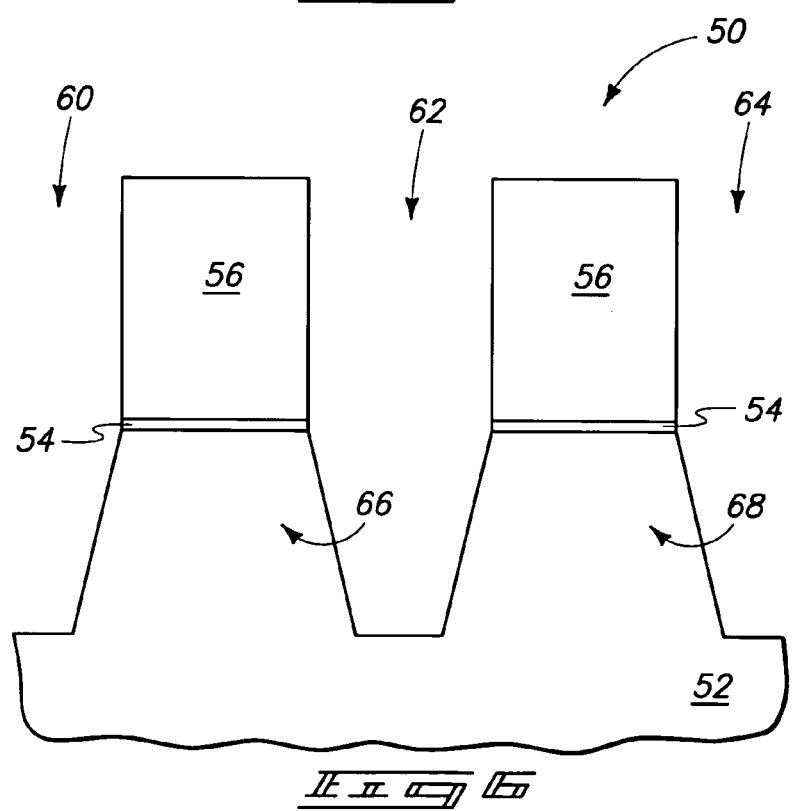

Referring to FIG. 6, the pattern of mask 58 (FIG. 5) is transferred through silicon nitride-containing layer 56 and pad oxide layer 54, and into base 52 to form isolation region trenches 60, 62 and 64 within base 52. The pattern of mask 58 may be transferred through layers 56 and 54, and into base 52, with any suitable etch or combination of etches; and mask 58 (FIG. 5) may be removed at any suitable processing stage.

Projecting regions of base 52 between the isolation region trenches correspond to active area locations 66 and 68. Accordingly, the formation of the isolation region trenches may be considered to define active area locations within base 52.

Referring to FIG. 7, electrically insulative material 70 is formed within isolation region trenches 60, 62 and 64; and subsequently planarization is conducted to form a planarized upper surface 71 extending across materials 56 and 70. Such planarization may comprise, for example, chemical-mechanical polishing (CMP). Material 70 may comprise any suitable composition or combination of compositions, and may comprise, consist essentially of, or consist of silicon dioxide.

The insulative material 70 within the isolation regions may be considered to have lower portions extending within base 52, and upper portions projecting upwardly over the base.

Referring to FIG. 8, silicon nitride-containing layer 56 (FIG. 7) and pad oxide 54 (FIG. 7) are removed, and gate dielectric 72 is formed across upper surfaces of active regions 66 and 68. The silicon nitride-containing layer 56 may be removed with an etch such as a hot phosphoric acid etch, and the pad oxide 54 may be removed with an etch such as a hydrofluoric acid etch.

Gate dielectric 72 may comprise any suitable composition or combination of compositions. For instance, gate dielectric 72 may comprise, consist essentially of, or consist of silicon dioxide thermally grown from exposed surfaces of a monocrystalline silicon wafer corresponding to base 52. If gate dielectric 72 consists of silicon dioxide, it may be referred to as tunnel oxide.

The removal of silicon nitride-containing layer 56 (FIG. 7) and pad oxide 54 (FIG. 7) leaves openings 74 and 76 between the upwardly projecting portions of insulative material 70, and over active region locations 66 and 68, respectively. Gate dielectric 72 may be considered to be formed across a bottom portion of such openings.

Figure 9:
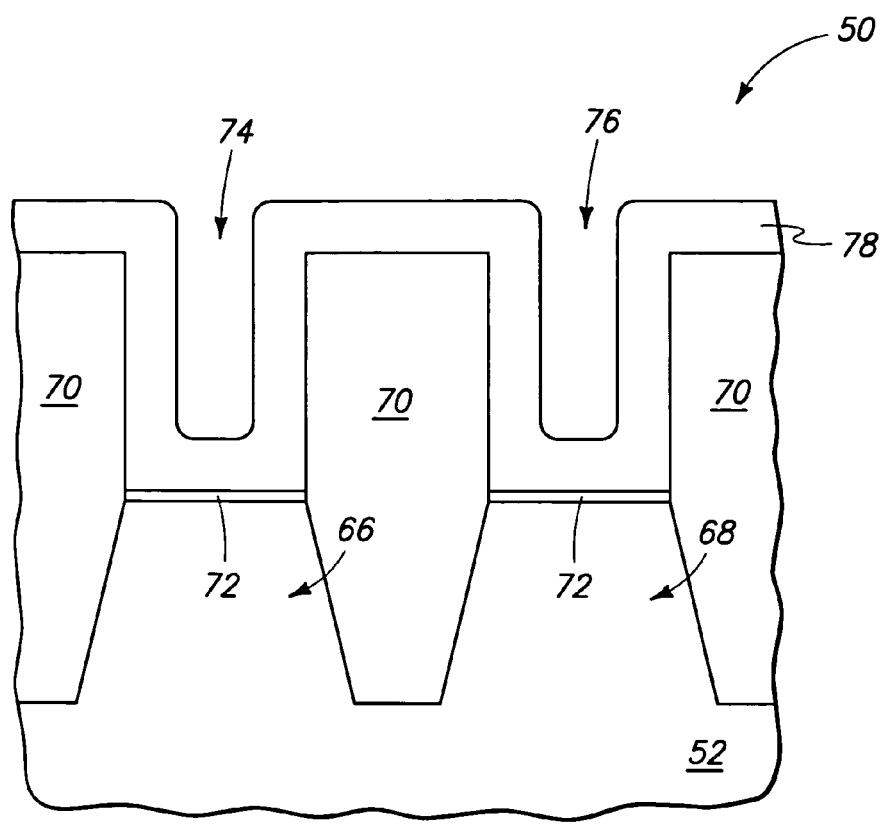

Referring to FIG. 9, a layer of spacer material 78 is formed across insulative material 70 and within openings 74 and 76 to narrow the openings. Spacer material 78 will typically be electrically insulative, and may comprise any suitable composition or combination of compositions. For instance, the spacer material may comprise, consist essentially of, or consist of silicon dioxide or silicon nitride.

Figure 10:
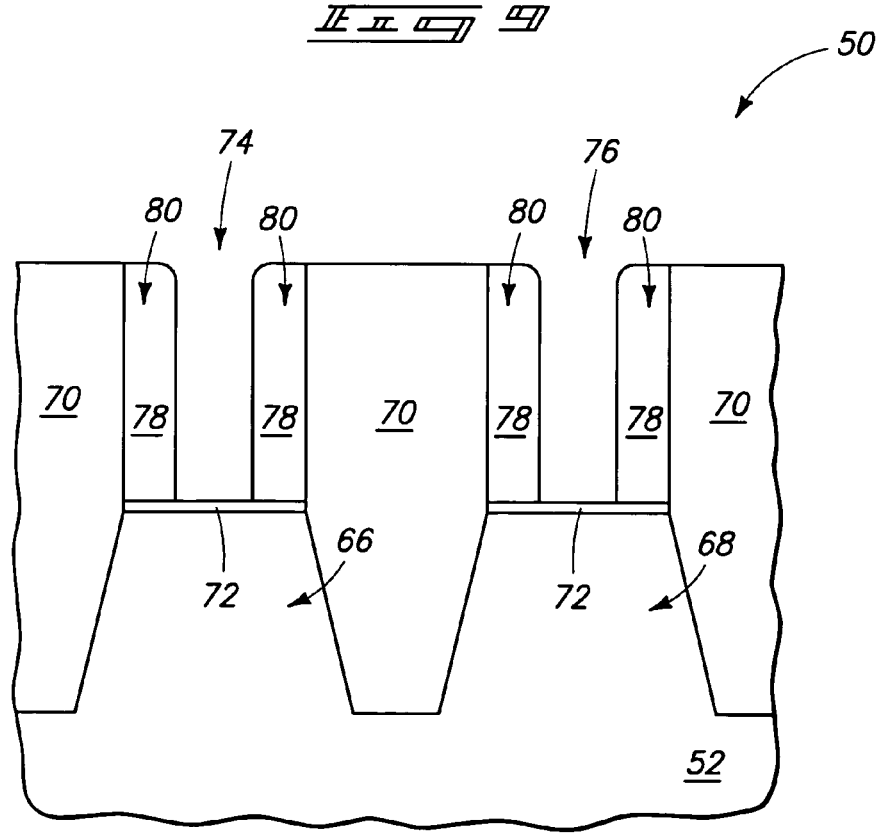

Referring to FIG. 10, spacer material 78 is anisotropically etched to form spacers 80 within openings 74 and 76.

Referring to FIG. 11, gate material 82 is formed within openings 74 and 76, and directly against gate dielectric 72. In the shown embodiment, gate dielectric 72 is the only dielectric within the openings as gate material 82 is formed, and thus an entirety of the gate dielectric is present prior to forming spacers 80. Other embodiments may have at least some gate dielectric material provided within the openings 74 and 76 after forming spacers 80 and prior to forming gate material 82.

The gate material 82 may comprise any suitable composition or combination of compositions, including, for example, metals, metal compositions, and/or semiconductor material. Ultimately, material 82 will be electrically conductive. However, in some embodiments material 82 may be a semiconductor material which is conductively-doped subsequent to the processing stage of FIG. 11; and accordingly material 82 is shown to not be conductive at the processing stage of FIG. 11. In other embodiments, at least a portion of material 82 is conductive at the processing stage of FIG. 11. Such other embodiments may include, for example, embodiments in which material 82 comprises semiconductor material which is in situ doped during deposition of the material. If material 82 comprises semiconductor material, the material may, for example, comprise, consist essentially of, or consist of silicon or Si/Ge. The semiconductor material may comprise any suitable crystalline phase or combination of phases, and thus may comprise one or more of amorphous, polycrystalline and monocrystalline phases.

Referring to FIG. 12, construction 50 is subjected to planarization (such as CMP) to remove material 82 from over insulative material 70, and to form a planarized upper surface 83 extending across materials 70, 78 and 82. The planarization may, in some embodiments, remove some of materials 70 and 78 to reduce the heights of materials 70 and 78.

The material 82 remaining over active area locations 66 and 68 may be considered to define upwardly projecting gate pillars 84 and 86.

Figure 13:
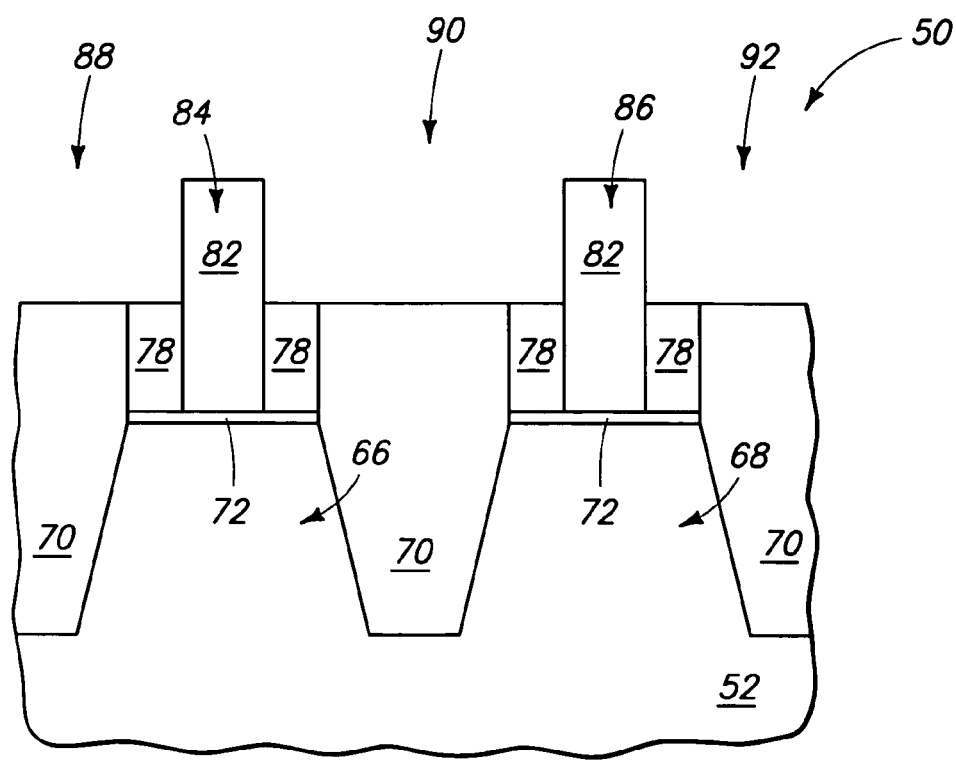

Referring to FIG. 13, materials 70 and 78 are selectively recessed relative to material 82. Such leaves gaps (or openings) 88, 90 and 92 adjacent upper regions of the upwardly extending gate pillars 84 and 86.

Figure 14:
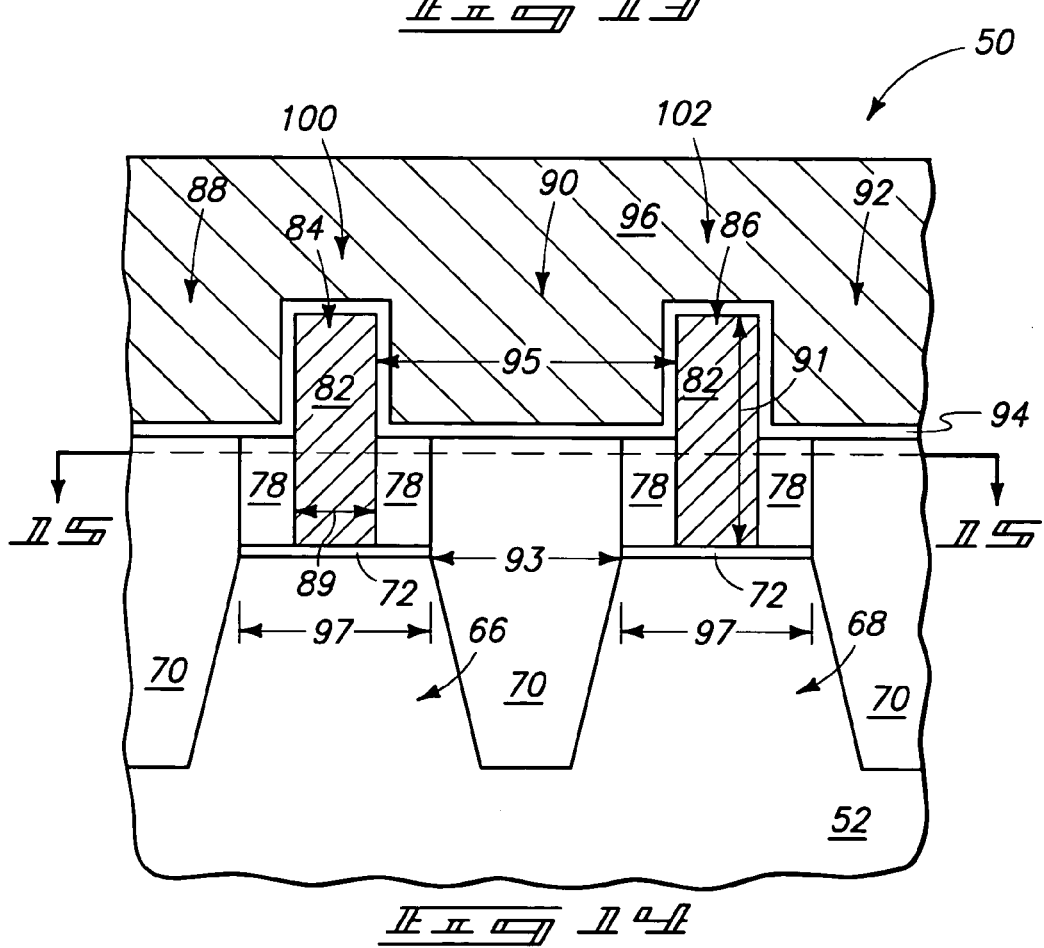

Referring to FIG. 14, gate material 82 is shown converted to an electrically conductive material. Such may be accomplished by conductively-doping a semiconductor material 82. Such conductive doping may comprise an implant of any suitable dopant or combination of dopants into semiconductor material 82.

Dielectric material 94 and control gate material 96 are formed over upwardly extending gate pillars 84 and 86, and within gaps 88, 90 and 92. In some embodiments, the dielectric material 94 may be considered to be formed within the gaps to narrow the gaps, and the control gate material 96 may be considered to be deposited within the narrowed gaps.

The dielectric material 94 may comprise any suitable composition or combination of compositions, including, for example, the compositions discussed above with reference to prior art dielectric material 34. The control gate material 96 may comprise any suitable composition or combination of compositions, including, for example, the compositions discussed above for prior art control gate material 36.

The upwardly projecting gate portions 84 and 86 correspond to floating gates of nonvolatile memory. The upwardly projecting gate portion 84 may be considered to be a floating gate of a first flash device 100 comprising gate portion 84 in combination with dielectric material 94 and control gate material 96; and upwardly projecting gate portion 86 may be considered to be a floating gate of a second flash device 102 comprising gate portion 86 in combination with dielectric material 94 and control gate material 96. Due to the entirety of the floating gates being formed between the spacers 80 (FIGS. 11 and 12), the entirety of the floating gates may have a sub-lithographic width (or in other words, a width less than the minimum feature size achievable by a lithographic process utilized to form the resist mask 58 of FIG. 5).

The floating gates have widths 89 (labeled for one of the gates) and heights 91 (labeled for the other of the gates). In some embodiments, the widths may be from about 10 nanometers to about 35 nanometers, and the heights may be greater than or equal to about 30 nanometers, with typical heights being from about 50 nanometers to about 75 nanometers.

The active areas within locations 66 and 68 have widths 97 along the top surface of base 52 within the active areas. Such widths may be less than or equal to about 50 nanometers, and may be about 35 nanometers in some embodiments. Accordingly, the widths 89 of the floating gates may be significantly less than the widths of the active areas along the cross-section of FIG. 14.

The cross-section of FIG. 14 may be considered to define an axis; and accordingly the widths of the floating gates may be considered to be less than the widths of the active areas along such axis.

The active areas within locations 66 and 68 may be considered to be neighboring active areas, or more specifically to be immediately adjacent one another. The active areas within locations 66 and 68 are separated from one another by a first distance 93 (with the distance 93 being the furthest distance between the active areas, and with it being understood that active areas may be vertically sloped so that some portions of adjacent active areas are closer to one another than other portions). The upwardly projecting gate portions 84 and 86 may be considered to correspond to immediately adjacent floating gates; with one of the floating gates being associated with the active area at location 66, and the other being associated with the neighboring active area at location 68. The upwardly projecting gate portions 84 and 86 are separated from one another by a second distance 95 which is greater than the first distance 93.

In some embodiments, first distance 93 may be less than or equal to 35 nanometers, and second distance 95 may be at least 45 nanometers. In such embodiments, second distance 95 may be considered to be at least about 10 angstroms greater than first distance 93; or alternatively to be at least about 25% greater than first distance 93. In contrast to the prior art construction of FIG. 2 comprising the inverted "T"-shaped floating gate, the embodiment of FIG. 14 may be considered to comprise an "I"-shaped floating gate. This advantageously provides an entirety of a floating gate to be spaced from an adjacent floating gate by a desired distance, rather than only spacing the top portion of the floating gate from the adjacent floating gate by the desired distance.

Although only two flash memory constructions are shown in FIG. 14, it is to be understood that a large number of the flash memory constructions may be simultaneously fabricated to form a flash memory array.

Figure 15:
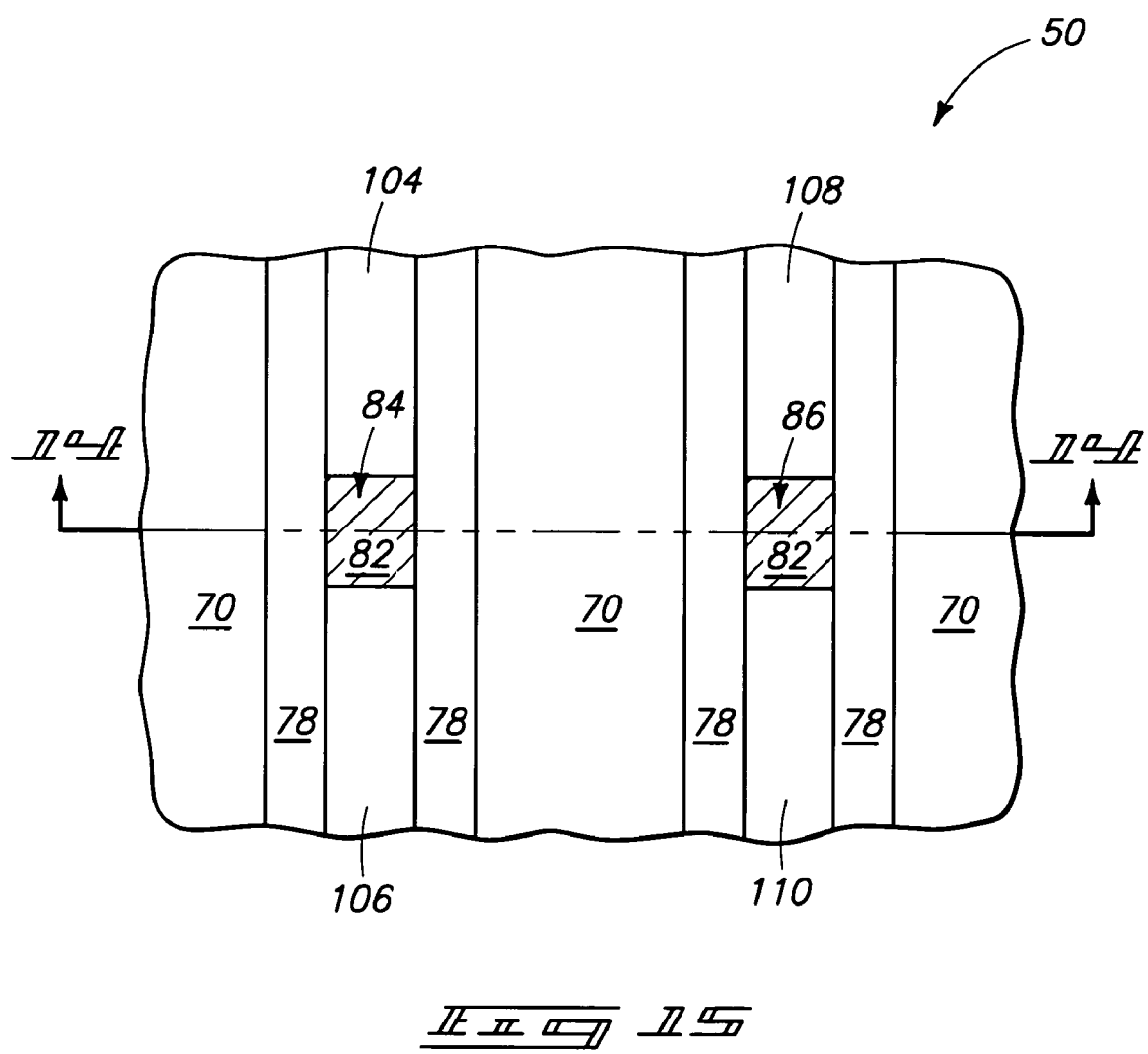

Referring to FIG. 15, construction 50 is shown in top view to illustrate that source/drain regions 104, 106, 108 and 110 may be provided proximate floating gates 84 and 86. The floating gates may gatedly connect source/drain regions on opposing sides of the gates to one another. Accordingly, the gate 84 may gatedly connect source/drain regions 104 and 106 to one another, and gate 86 may gatedly connect source/drain regions 108 and 110 to one another.

Notably, FIG. 15 also shows that the source/drain regions are not between the floating gates along the axis of FIG. 14. Further, FIG. 15 shows that the paired source/drain regions associated with a floating gate (for instance, the source/drain regions 104 and 106 associated with the floating gate 84) are along a second axis relative to the floating gate, with such second axis being substantially orthogonal to the axis of FIG. 14.

Although FIGS. 14 and 15 show only one floating gate associated with each active region, it is to be understood that more than one floating gate may be associated with a single active region. If more than one floating gate is associated with an active region, the floating gate 84 will be the closest floating gate associated with active area location 66 relative to floating gate 86, and floating gate 86 will be the closest floating gate associated with active area location 68 relative to floating gate 84.

The source/drain regions may be connected to bitlines and charge storage devices (for instance capacitors) to incorporate construction 50 into a memory array.

The embodiment of FIGS. 14 and 15 may reduce cross-coupling between adjacent flash memory cells by having the floating gates with larger pitch than the active areas associated with the adjacent floating gates. Specifically, the pitch between gates 84 and 86 is larger than the pitch between active areas in locations 66 and 68.

Figure 16:
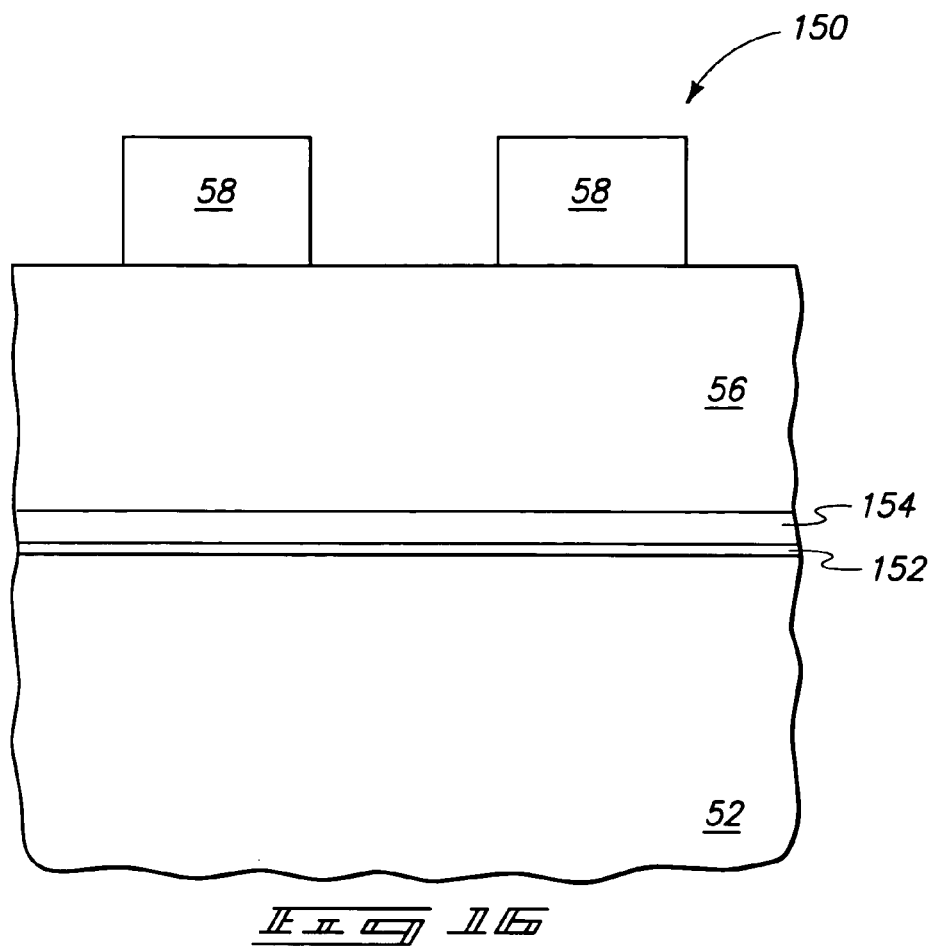
FIG. 16 is a diagrammatic view of a semiconductor wafer fragment shown at a preliminary processing stage.

Referring to FIG. 16, such illustrates a semiconductor construction 150 at a preliminary processing stage in accordance with another embodiment. Similar numbering will be used in describing construction 150 as was used above in describing the construction 50 of FIGS. 5-15, where appropriate.

Construction 150 comprises the base 52, silicon nitride-containing material 56 and patterned masking material 58 described previously with reference to FIG. 5. However, in contrast to FIG. 5, construction 150 comprises dielectric material 152 and semiconductor material 154 between base 52 and silicon nitride-containing layer 56, instead of pad oxide 54.

Dielectric material 152 may be identical to the material 72 discussed above with reference to FIG. 8.

Semiconductor material 154 may comprise any suitable composition or combination of compositions, and in some embodiments may comprise, consist essentially of, or consist of silicon or Si/Ge. Although semiconductor material 154 is shown to be non-conductive (in other words, without cross-hatching) at the processing stage of FIG. 16, it is to be understood that in some embodiments material 154 is conductively-doped at the processing stage of FIG. 16. Such may be accomplished by in situ doping material 154 during deposition of the material, and/or by implanting conductivity-enhancing dopant into material 154 after deposition of the material. Material 154 may comprise any suitable phase, and may, for example, comprise, consist essentially of, or consist of one or more of amorphous, polycrystalline and monocrystalline phases.

Figure 17:
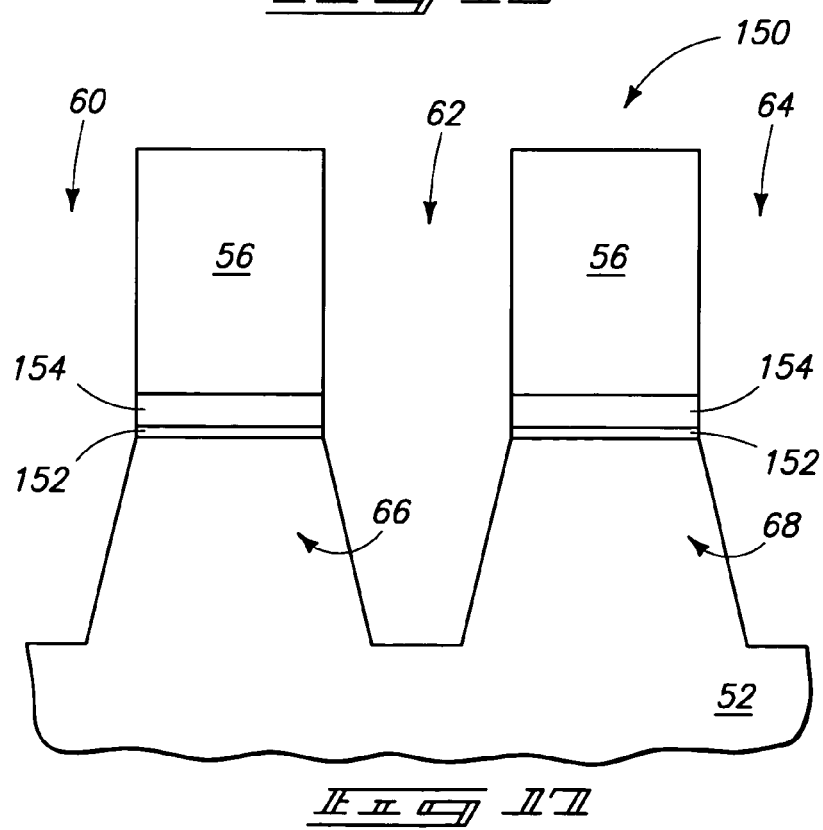

Referring to FIG. 17, the pattern of masking material 58 (FIG. 16) is transferred through materials 152, 154, and 56; and into base 52 to form isolation region trenches 60, 62 and 64. The transferring of the pattern from masking material 58 through materials 152, 154 and 56, and into the base, may be accomplished with any suitable etch or combination of etches; and mask 58 (FIG. 16) may be removed at any suitable processing stage.

The formation of isolation region trenches 60, 62 and 64 defines active area locations 66 and 68 within projections of base 52 remaining between the isolation region trenches.

Referring to FIG. 18, electrically insulative material 70 is formed within isolation region trenches 60, 62 and 64; and subsequently planarization is conducted to form a planarized upper surface 71 extending across materials 56 and 70.

Referring to FIG. 19, silicon nitride-containing layer 56 (FIG. 18) is removed to leave openings 74 and 76 between upwardly projecting portions of insulative material 70.

Figure 20:
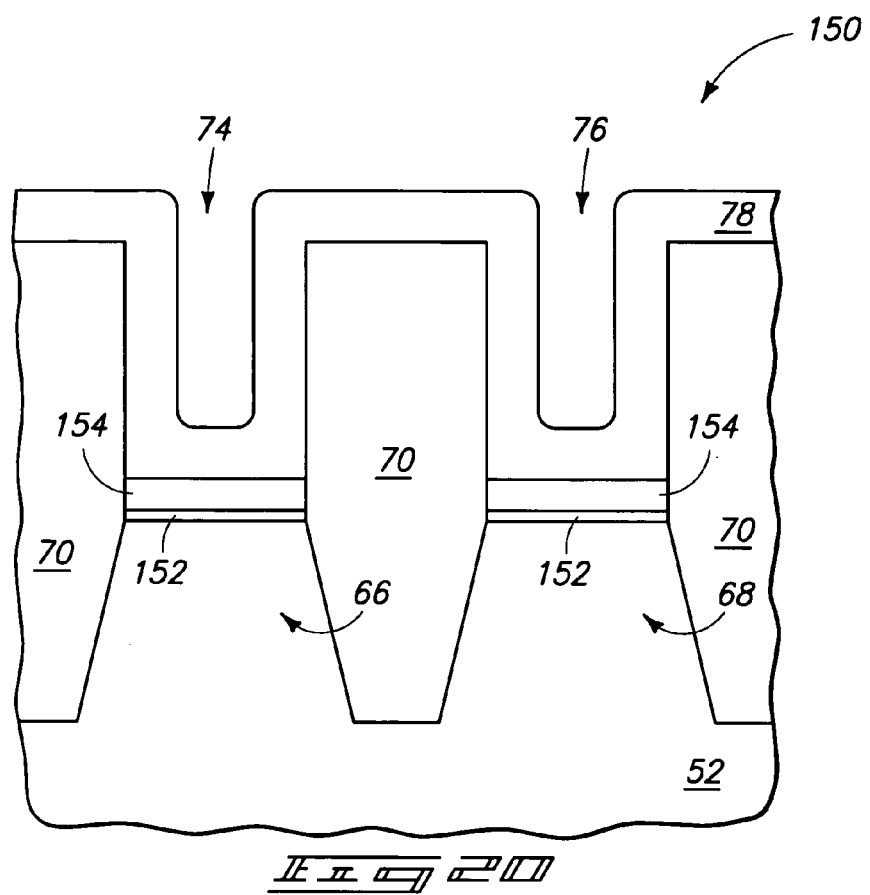

Referring to FIG. 20, the layer of spacer material 78 is formed across insulative material 70 and within openings 74 and 76 to narrow the openings.

Figure 21:
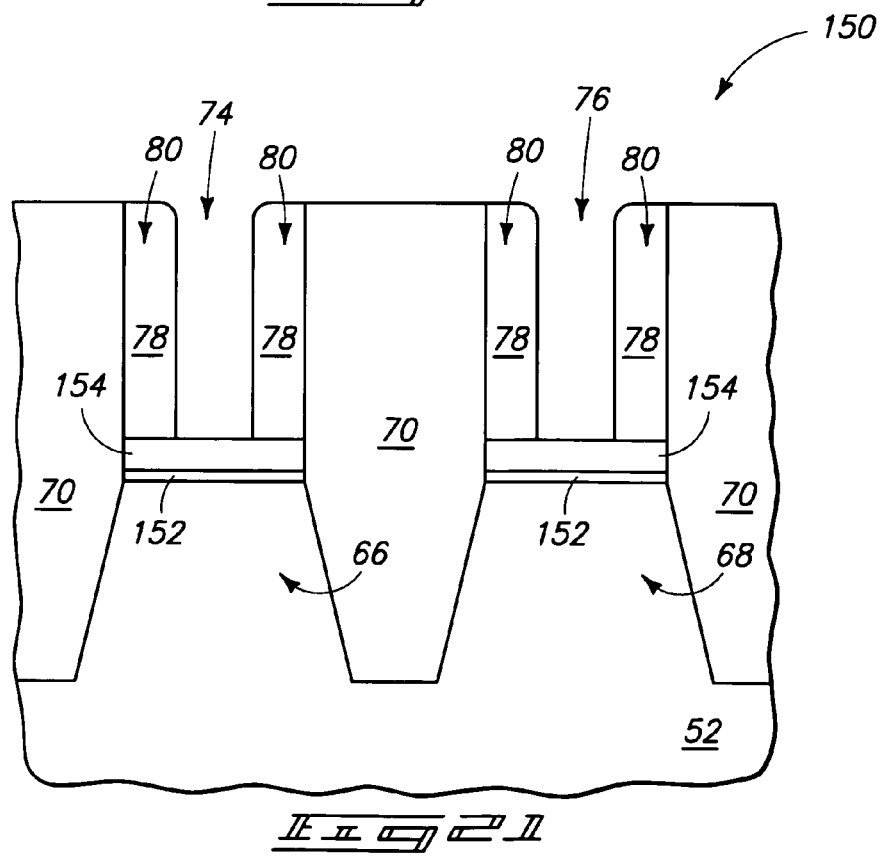

Referring to FIG. 21, spacer material 78 is anisotropically etched to form spacers 80 within openings 74 and 76.

Figure 22:
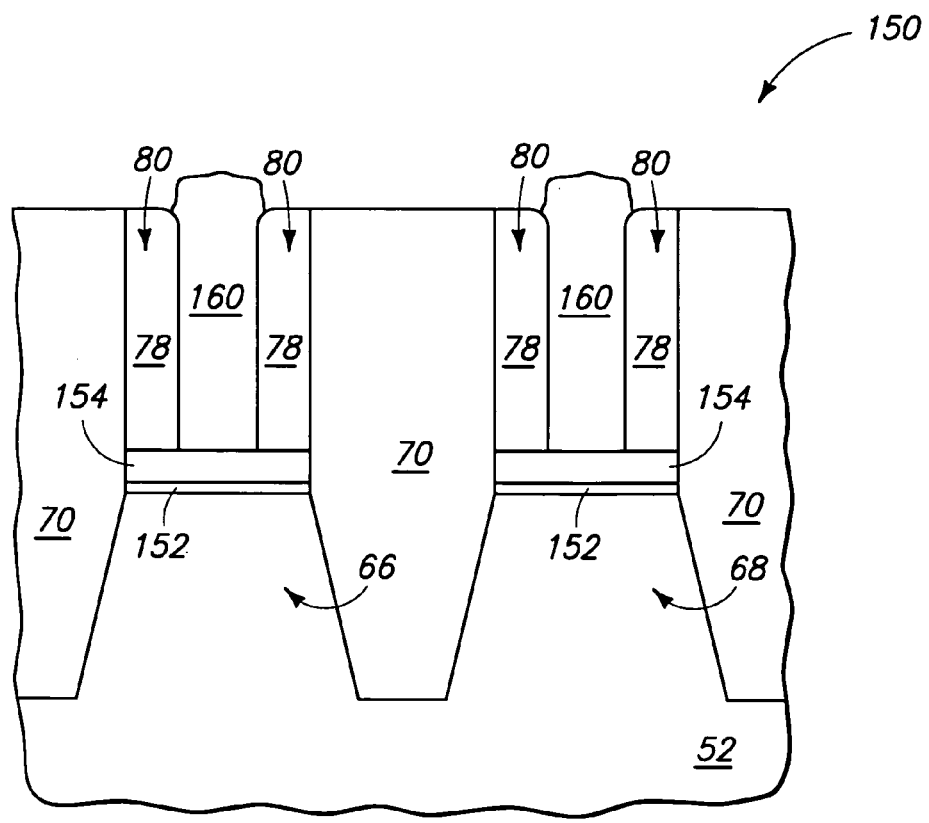

Referring to FIG. 22, material 160 is selectively epitaxially grown from a surface of semiconductor material 154. Material 160 may be a semiconductor material, and semiconductor materials 154 and 160 may be referred to as first and second semiconductor materials, respectively, to distinguish them from one another. Material 160 may comprise any suitable composition or combination of compositions; and may, for example, comprise, consist essentially of, or consist of one or more of silicon, Ge, and various metals. For instance, material 160 may comprise, consist essentially of, or consist of Si/Ge. Material 160 is shown to be non-conductive (in other words, without crosshatching) at the processing stage of FIG. 22, but it is to be understood that in other embodiments material 160 may be conductive as it is formed, and may, for example, be conductively-doped as it is formed.

The material 160 is shown grown to an elevation above spacers 80. It is to be understood that in other embodiments material 160 may be grown to an elevation less than or equal to the height of spacers 80.

The material 160 is shown having a rough upper surface as may occur if semiconductor material 160 is epitaxially grown from a polycrystalline material 154. It is to be understood that in other embodiments the epitaxially-grown material 160 may have a relatively smooth upper surface.

Figure 23:
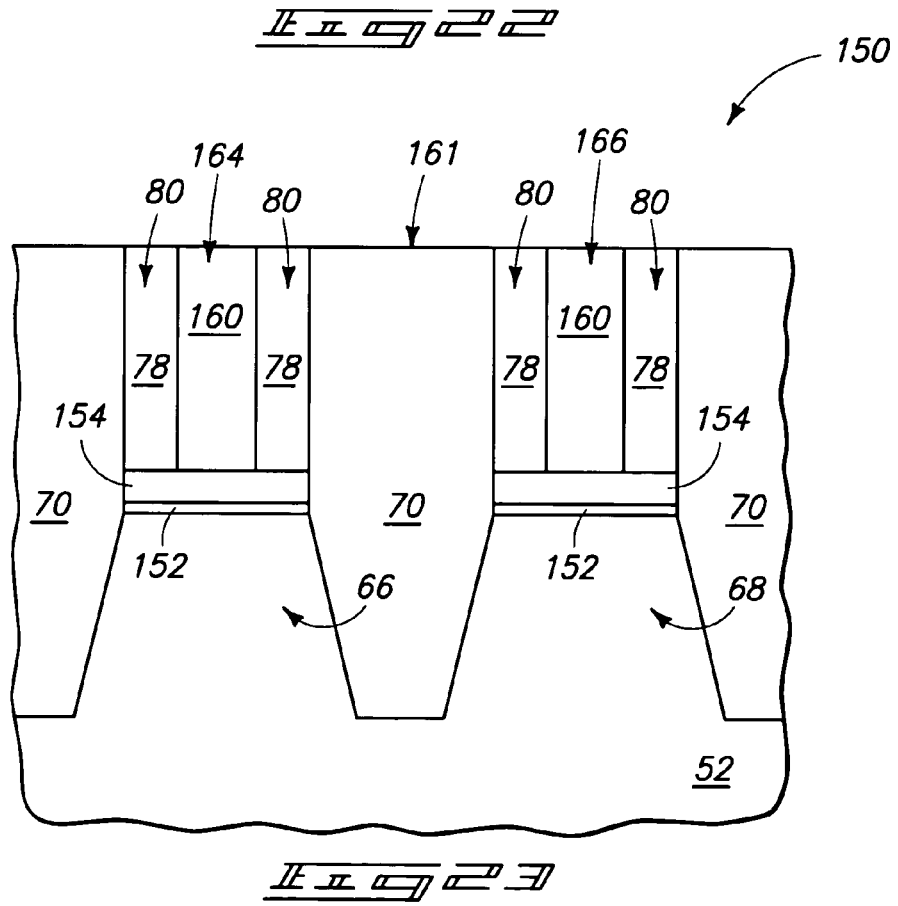

Referring to FIG. 23, construction 150 is subjected to planarization (such as CMP) to form a planarized upper surface 161 extending across materials 70, 78 and 160. In some embodiments, the planarization may remove some of materials 70 and 78 to reduce the heights of materials 70 and 78. In some embodiments, the height of material 160 may be reduced with an appropriate etch (such as, for example, a dry etch) instead of, or in addition to, planarization.

The material 160 remaining over active area locations 66 and 68 may be considered to define upwardly projecting gate pillars 164 and 166 analogous to the pillars 84 and 86 discussed previously.

Figure 24:
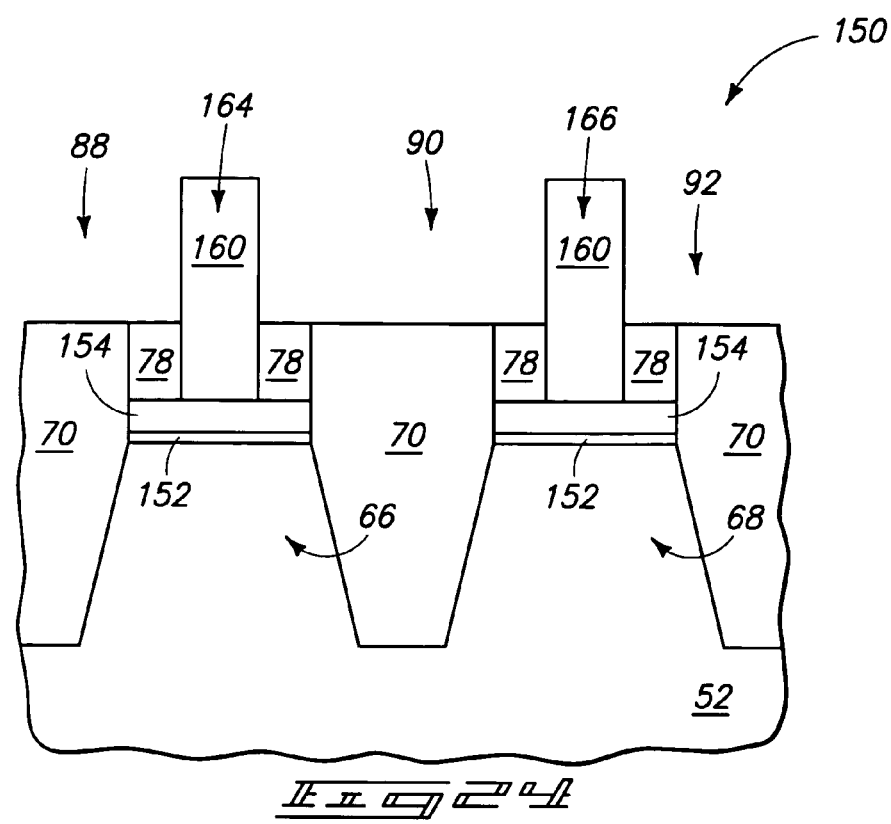

Referring to FIG. 24, materials 70 and 78 are selectively recessed relative to material 160: Such leaves gaps (or openings) 88, 90 and 92 adjacent upper regions of the upwardly extending gate pillars 164 and 166.

Figure 25:
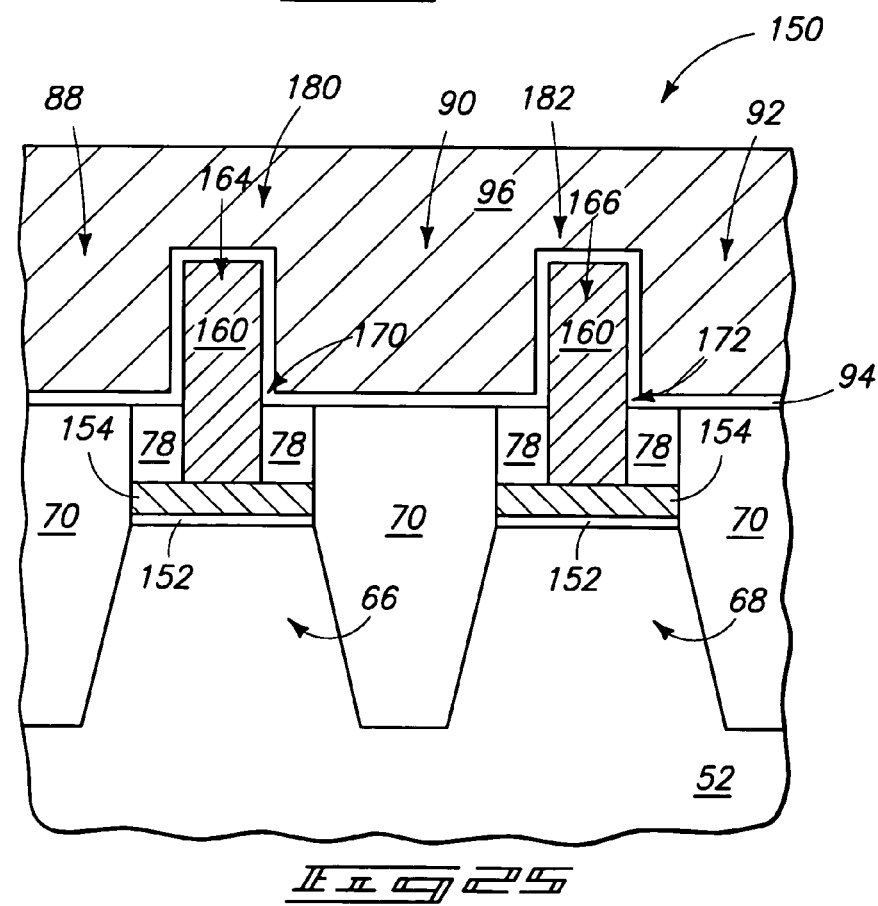

Referring to FIG. 25, semiconductor materials 154 and 160 are shown converted to electrically conductive materials. Such may be accomplished by implanting any suitable dopant or combination of dopants into semiconductor materials 154 and 160. The semiconductor materials 154 and 160 together correspond to floating gates of non-volatile memory constructions. Each floating gate is shaped as an inverted "T", with a base of the inverted "T" corresponding to material 154, and the stem of the inverted "T" corresponding to epitaxial material 160.

Dielectric material 94 and control gate material 96 are formed over upwardly extending pillars 164 and 166, and within gaps 88, 90 and 92.

The conductively-doped semiconductor materials 154 and 160 together correspond to floating gates 170 and 172 of nonvolatile memory; with semiconductor material 154 corresponding to wide portions of the floating gates, and a semiconductor material 160 corresponding to narrow portions of the floating gates.

Floating gate 170 is part of a first flash device 180 comprising the floating gate in combination with dielectric material 94 and control gate material 96; and floating gate 172 is part of a second flash device 182 comprising the floating gate in combination with dielectric material 94 and control gate material 96. Source/drain regions analogous to those discussed above with reference to FIG. 15 may be provided proximate floating gates 170 and 172 in locations outside of the plane of FIG. 25; and flash devices 180 and 182 may be incorporated into a memory array.

The floating gates 170 and 172 have narrow widths corresponding to material 160. Such narrow widths may be comparable to the width 89 shown in FIG. 14.

The flash devices of FIG. 25 are comparable to those discussed above with reference to prior art FIG. 2. However, the narrow portions of the floating gates of the structures of FIG. 25 may comprise selective epitaxially-grown semiconductor material 160, whereas the prior art devices utilized deposited semiconductor material 38 (FIG. 4). It may be advantageous to utilize epitaxially grown semiconductor material 160 for the floating gates instead of deposited semiconductor material for at least the following reasons: (1) there may be a reduced number of process steps since the chemical-mechanical polishing (CMP) of deposited polycrystalline silicon may be omitted for epitaxially grown material; (2) omission of CMP may avoid dishing-related complications; such as dishing-related complications pertaining to peripheral devices; (3) epitaxial growth may provide improved control over the heights of the floating gate pillars; and (4) omission of CMP may allow insulative materials 70 and 78 to be formed without an erosion margin that would otherwise be provided for CMP, the margin could cause complications with the fill of trenches 60, 62 and 64 due to an increased depth of the trenches utilized to achieve the margin.

Figure 26:
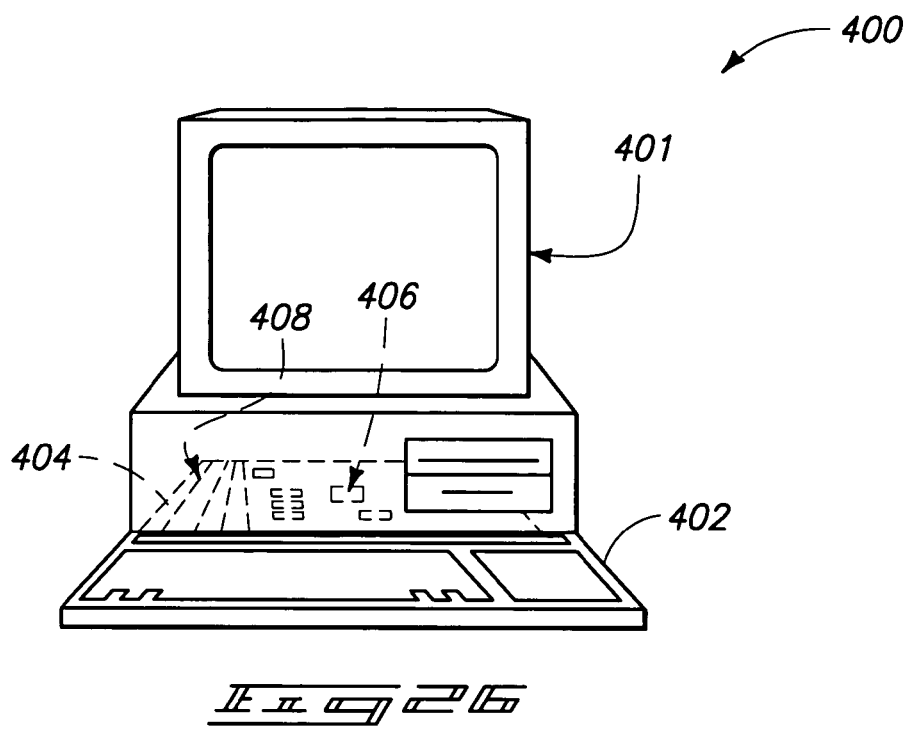
FIG. 26 is a diagrammatic view of a computer embodiment.
Figure 27:
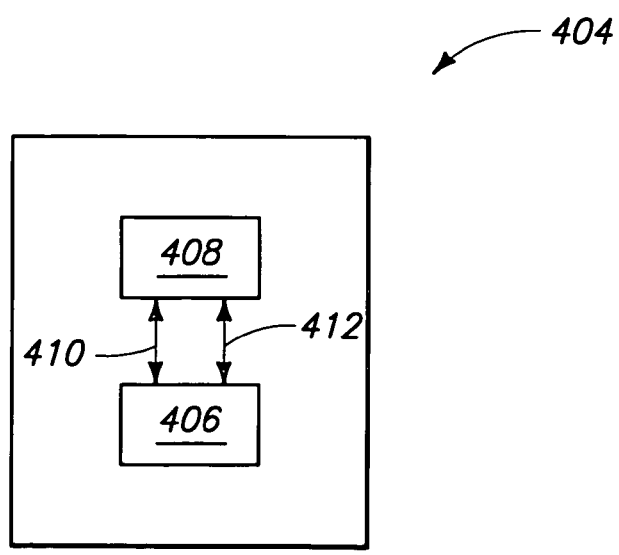
FIG. 27 is a block diagram showing particular features of the motherboard of the FIG. 26 computer embodiment.

FIG. 26 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 27. In such block diagram, the addressing circuitry is illustrated as 410 and the read circuitry is illustrated as 412.

Processor device 406 may correspond to a processor module, and associated memory utilized with the module may comprise flash structures.

Memory device 408 may correspond to a memory module, and may comprise flash memory.

FIG. 28 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include flash memory, such as a flash card.

FIG. 29 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may include flash memory.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a semiconductor construction from a semiconductor substrate having a plurality of active area locations defined within a monocrystalline semiconductor material, and having isolation regions adjacent the active area locations and separating the active area locations from one another; the semiconductor substrate having a layer of gate dielectric over the active area locations, and having a layer of polycrystalline semiconductor material over the gate dielectric and between the isolation regions; the isolation regions comprising insulative material that extends above the active area locations and defines openings over the polycrystalline semiconductor material; the method comprising:
   forming spacers within the openings to narrow the openings;
   epitaxially growing electrically conductive gate material within the narrowed openings from the polycrystalline semiconductor material; and
   forming source/drain regions within the active area locations, the source/drain regions being gatedly coupled to one another through the electrically conductive gate material.

2. A method of forming a semiconductor construction from a structure comprising a semiconductor wafer, gate dielectric across the wafer, first semiconductor material across the gate dielectric, a silicon nitride-containing layer across the first semiconductor material, and a patterned mask over the silicon nitride-containing layer; the method comprising:
   transferring a pattern of the mask through the silicon nitride-containing layer, first semiconductor material and gate dielectric, and into the wafer to form isolation region trenches within the wafer and to define active area locations within the wafer between the trenches;
   forming insulative material within the isolation region trenches and over the silicon nitride-containing layer;
   planarizing the insulative material to remove it from over the silicon nitride-containing layer, the planarized insulative material having portions projecting upwardly over the wafer;
   removing the silicon nitride-containing layer to leave openings over the first semiconductor material and between the upwardly projecting portions of the insulative material;
   forming spacers within the openings to narrow the openings;
   epitaxially growing second semiconductor material from the first semiconductor material and within the narrowed openings;
   conductively doping the first and second semiconductor materials to form conductive gate material from the first and second semiconductor materials; and
   forming source/drain regions within the active area locations, the source/drain regions being gatedly coupled to one another through the conductive gate material.

3. The method of claim 1 wherein the conductive gate material is grown to a first height, and further comprising reducing the height of the conductive gate material to a second height.

4. The method of claim 3 wherein the reduction in the height of the conductive gate material comprises a dry etch.

5. The method of claim 3 wherein the reduction in the height of the conductive gate material comprises chemical-mechanical polishing.

6. The method of claim 1 wherein the conductive gate material is grown to above a height of the insulative material of the isolation regions, and further comprising planarizing the conductive gate material to about a height of the insulative material of the isolation regions.

7. The method of claim 6 wherein the planarized electrically conductive gate material forms upwardly projecting gate pillars; wherein adjacent active area locations are spaced from one another by a first distance; and wherein adjacent upwardly projecting gate pillars are spaced from one another by a second distance which is at least about 10 angstroms greater than the first distance.

8. The method of claim 6 wherein the planarized electrically conductive gate material forms upwardly projecting gate pillars; wherein adjacent active area locations are spaced from one another by a first distance; and wherein adjacent upwardly projecting gate pillars are spaced from one another by a second distance which is at least about 25% greater than the first distance.

9. The method of claim 2 wherein the first semiconductor material comprises polycrystalline silicon.

10. The method of claim 2 wherein the second semiconductor material comprises silicon.

11. The method of claim 2 wherein the first semiconductor material comprises polycrystalline Si/Ge.

12. The method of claim 2 wherein the second semiconductor material comprises Si/Ge.

13. The method of claim 2 wherein the conductive doping of the first and second semiconductor materials comprises implanting conductivity-enhancing dopant into the first and second semiconductor materials.

14. The method of claim 13 wherein the implanting of at least some of the conductivity-enhancing dopant into the first semiconductor material occurs prior to the growth of the second semiconductor material.

15. The method of claim 2 wherein the second semiconductor material is grown to above a height of the insulative material of the isolation regions, and further comprising planarizing the second semiconductor material to about a height of the insulative material of the isolation regions.

16. The method of claim 15 wherein the planarized second semiconductor material forms upwardly projecting gate pillars; wherein adjacent active area locations are spaced from one another by a first distance; and wherein adjacent upwardly projecting gate pillars are spaced from one another by a second distance which is at least about 25% greater than the first distance.

17. The method of claim 16 further comprising:
reducing heights of the isolation region insulative material and of the spacers to form gaps between adjacent upwardly projecting gate pillars;
forming dielectric material within the gaps to narrow the gaps;
forming electrically conductive control gate material within the narrowed gaps; and
wherein the doping of the second semiconductor material occurs prior to the reduction of the heights of the isolation region insulative material and of the spacers.

* * * * *

UNITED STATES PATENT AND TRADEMARK OFFICE
CERTIFICATE OF CORRECTION

PATENT NO. : 7,588,982 B2 Page 1 of 1
APPLICATION NO. : 11/512781
DATED : September 15, 2009
INVENTOR(S) : Sandhu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 172 days.

Signed and Sealed this

Twenty-first Day of September, 2010

David J. Kappos
*Director of the United States Patent and Trademark Office*